United States Patent
Hiyama et al.

(10) Patent No.: US 6,891,707 B2
(45) Date of Patent: May 10, 2005

(54) SEMICONDUCTOR PROTECTION CIRCUIT

(75) Inventors: Kazuaki Hiyama, Fukuoka (JP);
Akihisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 530 days.

(21) Appl. No.: 09/984,491

(22) Filed: Oct. 30, 2001

(65) Prior Publication Data

US 2002/0176215 A1 Nov. 28, 2002

(30) Foreign Application Priority Data

May 28, 2001 (JP) ........................................ 2001-158962

(51) Int. Cl.[7] ................................................ H02H 3/08
(52) U.S. Cl. .................... 361/93.1; 361/93.7; 361/93.9; 327/427; 307/125; 307/126
(58) Field of Search ............... 361/93.1, 93.7, 361/93.9; 327/427; 307/125, 126

(56) References Cited

FOREIGN PATENT DOCUMENTS

| JP | 6-53795 | 2/1994 |
|----|---------|--------|
| JP | 7-183781 | 7/1995 |
| JP | 9-64707 | 3/1997 |
| JP | 11-68535 | 3/1999 |

*Primary Examiner*—Brian Sircis
*Assistant Examiner*—Robert L. Deberadinis
(74) *Attorney, Agent, or Firm*—Oblon, Spivak, McClelland, Maier & Neustadt, P.C.

(57) ABSTRACT

In a semiconductor protection circuit comprising a low speed protection circuit having an overcurrent detector for detecting an overcurrent of a predetermined switching element and turning off the semiconductor switching element following detection of the overcurrent, and a high speed protection circuit turning off the semiconductor switching element based on a voltage signal proportional to an output voltage of the semiconductor switching element.

4 Claims, 8 Drawing Sheets

SEMICONDUCTOR PROTECTION CIRCUIT

BACKGROUND OF THE INVENTION

The present invention relates to a semiconductor protection circuit for turning off a semiconductor switching element if overcurrent is carried to the semiconductor switching element when trouble such as short-circuit occurs to a power control circuit provided with the semiconductor switching element.

Generally, a power control circuit into which a semiconductor switching element, such as an IGBT, is incorporated is provided with a protection circuit for protecting the semiconductor switching element from overcurrent. This protection circuit detects a load current according to a change in emitter output for current detection or a change in the voltage drop of a current detection resistor in the semiconductor switching element, and shuts off a gate input voltage being applied to the semiconductor switching element if, for example, a high current (to be referred to as "short-circuit current" hereinafter) is carried to the semiconductor switching element following the occurrence of trouble such as short-circuit, thereby turning off the semiconductor switching element. Normally, response delay of about several microseconds exists between the occurrence of trouble such as load short-circuit and the operation of the protection circuit. For that reason, there is a possibility that the semiconductor switching element is broken before the gate current (or voltage) is shut off by the operation of the protection circuit. To deal with such a disadvantage, there is known hitherto use of an RTC (real-time control) circuit which responds faster than the protection circuit. The RTC circuit operates to suppress the output current of the semiconductor switching element to a certain level or less and prevents the semiconductor switching element from being broken before the protection circuit starts its operation.

FIG. 7 shows a part of the configuration of a power control circuit employing a semiconductor protection circuit provided with a conventional RTC circuit. In the power control circuit, a protection circuit 80 is connected to the gate of a semiconductor switching element 103 through an output stage 101 and a resistor 102 and an RTC circuit 90 is connected between the gate and the source (or between the base and the emitter) of the semiconductor switching element 103. The protection circuit 80 has an AND circuit 81, a flip-flop circuit 82, a comparator 83 and a reference voltage source 84. A voltage signal proportional to an output current from the semiconductor switching element 103 is inputted into this protection circuit 80. If an input voltage exceeds a voltage applied from the reference voltage source 84, the comparator 83 turns the signal inputted into the output stage 101 through the AND circuit 81 into an off state to thereby turn off the semiconductor switching element 103. In this case, however, an operating signal is transmitted by way of the comparator 83, the AND circuit 81 and the output stage 101 in this order. Due to this, large delay exists from the time the output current reaches a protection level until the semiconductor switching element 103 becomes inoperative.

If a motor is used and an inductance component becomes a heavy load, the output current of the semiconductor switching element 103 increases relatively mildly with a ratio of time×output voltage/load inductance. The delay of the protection circuit does not cause a problem. However, if a resistor or a capacity component is a main component such as load short-circuit, the output current of the semiconductor switching element 103 has a sudden increase. As a result, before the protection circuit 80 is actuated to shut off the current to the semiconductor switching element 103, the element 103 may possibly be broken.

The RTC circuit 90 normally has two resistor-potential dividing elements 91 and 92 dividing the voltage of a resistor 104 connected to the current detection output of the semiconductor switching element 103, an MOSFET 93 (or bipolar transistor), and a resistor 105 connected to the gate of the semiconductor switching element 103. As in the case of the protection circuit 80, a voltage signal proportional to the output current of the semiconductor switching element 103 is inputted into the RTC circuit 90. The voltage signal is inputted into the gate of the MOSFET 93 (or the base of the bipolar transistor) through the resistor-potential dividing element 91. If the semiconductor switching element 103 is normally turned on, a gate voltage sufficiently higher than the threshold voltage of the element 103 is applied to the element 103 up to saturation so as to sufficiently lower on-resistance. During a normal state in which the current carried to the semiconductor switching element 103 is equal to or lower than a rated value, the MOSFET 93 is turned off and the MOSFET 93 does not influence the operation of the semiconductor switching element 103. If the output current increases and the MOSFET 93 is turned on, then the gate voltage of the semiconductor switching element 103 decreases to thereby turn the semiconductor switching element 103 into an active operation state. Then, the on-resistance of the semiconductor switching element 103 increases and the output current decreases, accordingly. If the output current decreases, the input voltage of the RTC circuit 90 decreases, whereby the function of the RTC circuit 90 for decreasing the input voltage of the semiconductor switching element 103 deteriorates.

As can be seen, the RTC circuit 90 forms a kind of a negative feedback circuit and operates to suppress the output current of the semiconductor switching element 103 to be a certain value or less. Although the RTC circuit 90 only cannot turn off the semiconductor switching element 103, the circuit configuration of the RTC circuit 90 is relatively simple and operation delay with respect to the protection circuit 80 is small. If trouble such as load short-circuit occurs and the output current suddenly increases, the RTC circuit 90 operates prior to the protection circuit 80, suppresses the output current of the semiconductor switching element 103 and then the protection circuit 80 turns off the semiconductor switching element 103.

Meanwhile, if the RTC circuit 90 is used along with the protection circuit 80, the semiconductor switching element 103 may possibly be broken at the time trouble such as load short-circuit occurs. FIG. 8 is a graph showing a change in the collector current Ic of the semiconductor switching element 103 and a change in the current Isens of the current detection terminal of the semiconductor switching element 103 in accordance with the operation of the RTC circuit 90. As can be seen from FIG. 8, when the RTC circuit 90 operates, the output current of the semiconductor switching element 103 rapidly increases and decreases repeatedly to form an oscillation waveform. Due to this, the current distributions of the respective components of the semiconductor switching element 103 are not uniform, with the result that a phenomenon that a current is concentrated only in a part of the components of the semiconductor switching element 103 and the part of the components is broken.

Further, when the protection circuit 80 operates, the input current (or voltage) of the semiconductor switching element 103 has been decreased by the RTC circuit 90. Due to this, the semiconductor switching element 103 is turned off faster than usual and a change in output current per unit time (di/dt) becomes often larger. As a result, a surge voltage exceeding the withstand voltage of the semiconductor switching element 103 is generated by the electromotive force of wiring inductance and the semiconductor switching element 103 is broken.

To avoid the above-stated problems, it is necessary to optimize the operation timing of the protection circuit 80 and that of the RTC circuit 90. Nevertheless, since the optimum timing of the protection circuit 80 and that of the RTC circuit 90 vary according to the state of the load and that of the semiconductor switching element 103, it is difficult to prevent the semiconductor switching element 103 from being broken under all conditions.

The present invention has been made in consideration of the above technical problems and it is, therefore, an object of the present invention to provide a semiconductor protection circuit capable of swiftly shutting off a current carried to a semiconductor switching element and ensuring the prevention of the semiconductor switching element from being broken if trouble such as load short-circuit occurs.

SUMMARY OF THE INVENTION

In an aspect of the present invention, there is provided a protection circuit comprising: a low speed protection circuit having overcurrent detector for detecting an overcurrent in a predetermined semiconductor switching element, and turning off the semiconductor switching element following detection of the overcurrent; and a high speed protection circuit turning off the semiconductor switching element based on a voltage signal proportional to an output current from the semiconductor switching element, the semiconductor protection circuit is characterized in that the high speed protection circuit includes: a MOSFET having a drain connected to a gate of the semiconductor switching element; a diode having a cathode which is connected to a gate of the MOSFET, and a anode through which the voltage signal proportional to the output current from the semiconductor switching element is inputted to the diode; and a capacitor having one end connected to said cathode of the diode and to said gate of the MOSFET.

In addition, a first resistor with a predetermined resistance value may be connected to the capacitor in parallel.

Furthermore, a second resistor with a predetermined resistance value may be connected between the diode and the capacitor in series.

Moreover, a transmission diode, having an anode connected to the capacitor and a cathode connected to said overcurrent detector in the low speed protection circuit, may be provided between the capacitor and the overcurrent detector.

DETAILED DESCRIPTION OF THE INVENTION

The embodiments of the present invention will be described hereinafter with reference to the accompanying drawings.

First Embodiment

Figure 1:
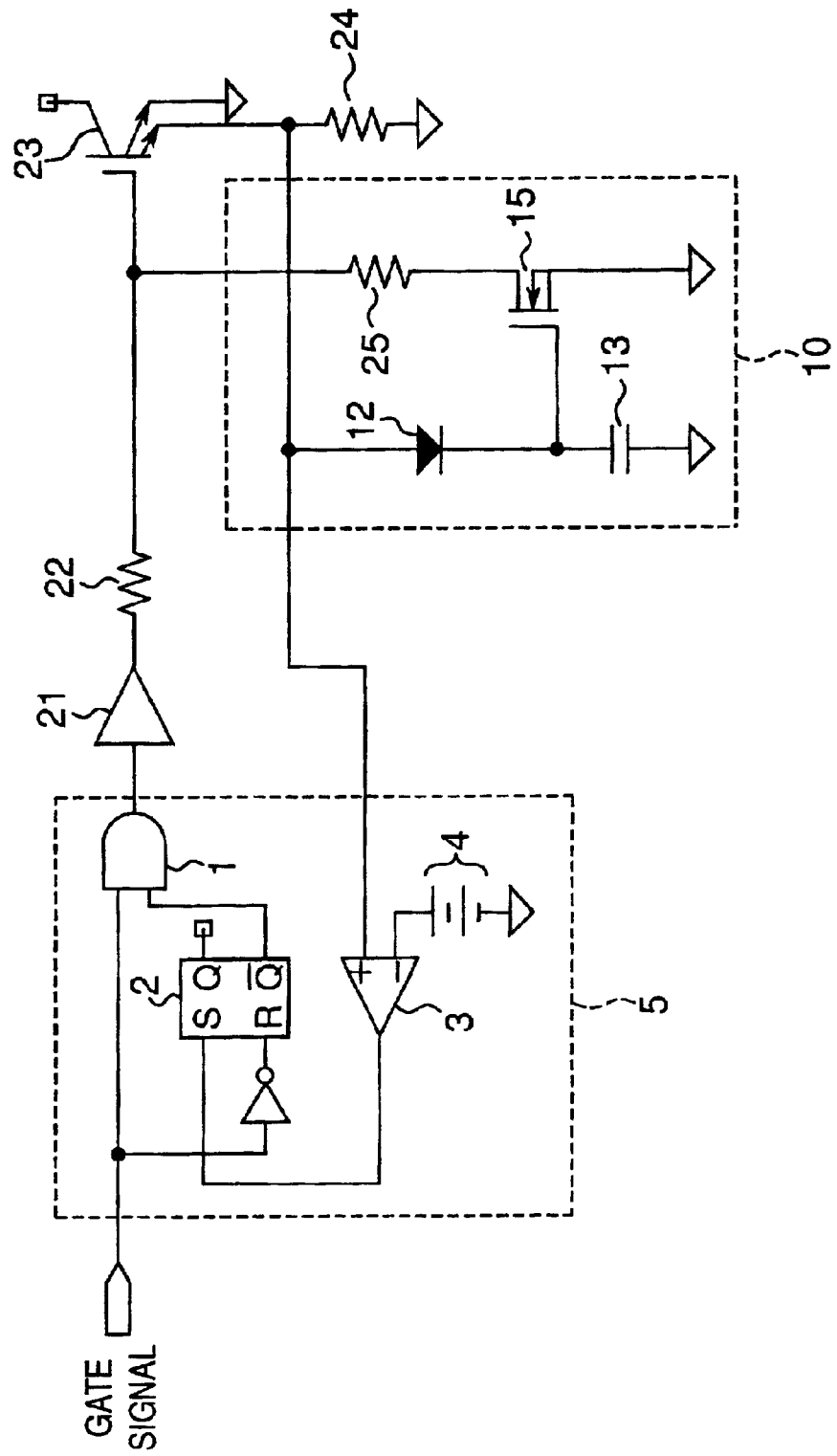
FIG. 1 is a block diagram showing a part of the configuration of a power control circuit employing a semiconductor protection circuit consisting of a low speed protection circuit and a high speed protection circuit according to the first embodiment of the present invention.

FIG. 1 shows apart of the configuration of a power control circuit employing a semiconductor protection circuit consisting of a low speed protection circuit and a high speed protection circuit according to the first embodiment of the present invention. This semiconductor protection circuit has a low speed protection circuit 5 provided on a transmission path for transmitting the gate signal to a semiconductor switching element 23 and constituted to input, as an input signal, a voltage signal proportional to an output current from the semiconductor switching element 23, and an FAS (FAST SHUT DOWN) circuit 10 which is a high speed protection circuit turning off the semiconductor switching element 23 based on a voltage signal proportional to the output current from semiconductor switching element 23. Also, in the semiconductor protection circuit, an output stage 21 and a resistor 22 connected to each other in series are provided between the output of the low speed protection circuit 5 and the gate of the semiconductor switching element 23. Furthermore, a current detection resistor (so-called shunt resistor) 24 is connected to the current detection emitter of the semiconductor switching element 23.

The low speed protection circuit 5 has an AND circuit 1, a flip-flop circuit 2, a comparator 3 and a reference voltage source 4. A voltage signal proportional to an output current from the semiconductor switching element 23 is inputted, as an input signal, into the low speed protection circuit 5. If an input voltage exceeds a voltage applied from the reference voltage source 4 in comparator 3, the signal inputted into the output stage 21 through the AND circuit 1 is shut off, to thereby turn off the semiconductor switching element 23. In this case, based on the set voltage of the reference voltage source 4, an output current level with which the low speed protection circuit 5 operates can be arbitrarily set.

On the other hand, the FAS circuit 10 has an MOSFET 15 having a drain connected to the gate of the semiconductor switching element 23, a switching diode 12 having a cathode connected to the gate of a MOSFET 15 and an anode through which a voltage signal proportional to the output current of the semiconductor switching element 23 is inputted to switching diode 12, and a capacitor 13 having one end connected to the cathode of the diode 12 and the gate of the MOSFET 15. The FAS circuit 10 also has a resistor 25 connected between the drain of the MOSFET 15 and the gate of the semiconductor switching element 23.

A voltage signal proportional to a current detection emitter current is inputted, as an input signal, into the FAS circuit 10 as in the case of the low speed protection circuit 5. The voltage signal is supplied to the capacitor 13 through the switching diode 12, thereby holding a voltage corresponding to the capacity of the capacitor 13. Namely, the switching diode 12 and the capacitor 13 operate, as a whole, as a hold circuit for holding the gate voltage of the MOSFET 15.

Figure 2:
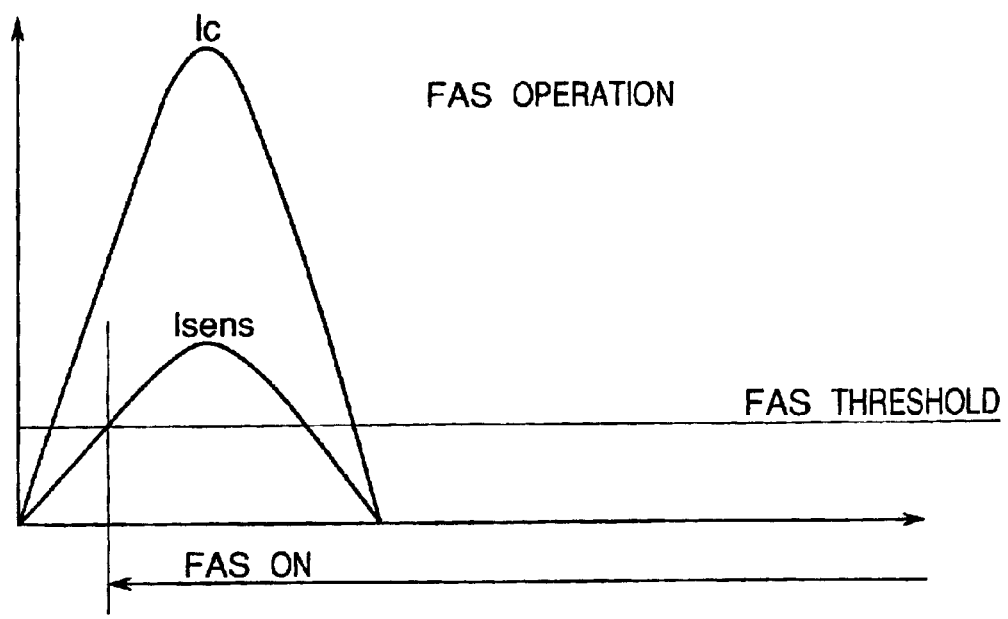
FIG. 2 is a graph showing the waveform of the collector current Ic of a semiconductor switching element and that of the current Isens of the current detection terminal of the semiconductor switching element when the high speed protection circuit operates.

FIG. 2 is a graph showing the waveform of the collector current Ic of the semiconductor switching element 23 and that of the current Isens of the current detection terminal (sense emitter) of the semiconductor switching element 23. A current 1/n times lower than the current of the emitter terminal of the semiconductor switching element 23 flows in the sense emitter of the semiconductor switching element 23. For example, if a high collector current Ic flows in the semiconductor switching element 23 following the occurrence of trouble such as short-circuit, the current Isens of the sense emitter increases. At the same time, the gate voltage of the MOSFET 15 in the FAS circuit 10 increases, as well. If the gate voltage of the MOSFET 15 exceeds a threshold value ("FAS threshold value" in FIG. 2), the MOSFET 15 is turned on. Following this, a part of a gate signal carried to the semiconductor switching element 23 flows into the FAS circuit 10 through the resistor 25 and the gate voltage of the semiconductor switching element 23 decreases. It is assumed that the resistance values of the resistors 25 and 22 are set so that the gate voltage herein is lower than the gate threshold value of the semiconductor switching element 23. As a result, the current Isens in the sense emitter of the semiconductor switching element 23, i.e., the output current of the semiconductor switching element 23 decreases. At this moment, the gate voltage of the MOSFET 15 is held by the function of the hold circuit consisting of the switching diode 12 and the capacitor 13 in the FAS circuit 10. Due to this, even if the voltage of the current detection resistor 24 becomes 0V, the gate voltage of the MOSFET 15 is held and the MOSFET 15 itself is not turned off.

As can be evident from FIG. 2, when the FAS circuit 10 operates, the output current of the semiconductor switching element 23 gradually decreases and the semiconductor switching element 23 is completely turned off. This can prevent the current distributions of the respective components from becoming non-uniform and avoid the operation that a surge voltage occurs during the operation of the low speed protection circuit 5. According to the low speed protection circuit 5 and the FAS circuit 10 in the first embodiment, if overcurrent is carried to the semiconductor switching element 23 following the occurrence of trouble such as short-circuit, it is possible to ensure protecting the semiconductor switching element 23.

Other embodiments of the present invention will be described hereinafter. It is noted that the same constituent elements as those in the first embodiment are denoted by the same reference symbols and no further description will be given thereto.

Second Embodiment.

Figure 3:
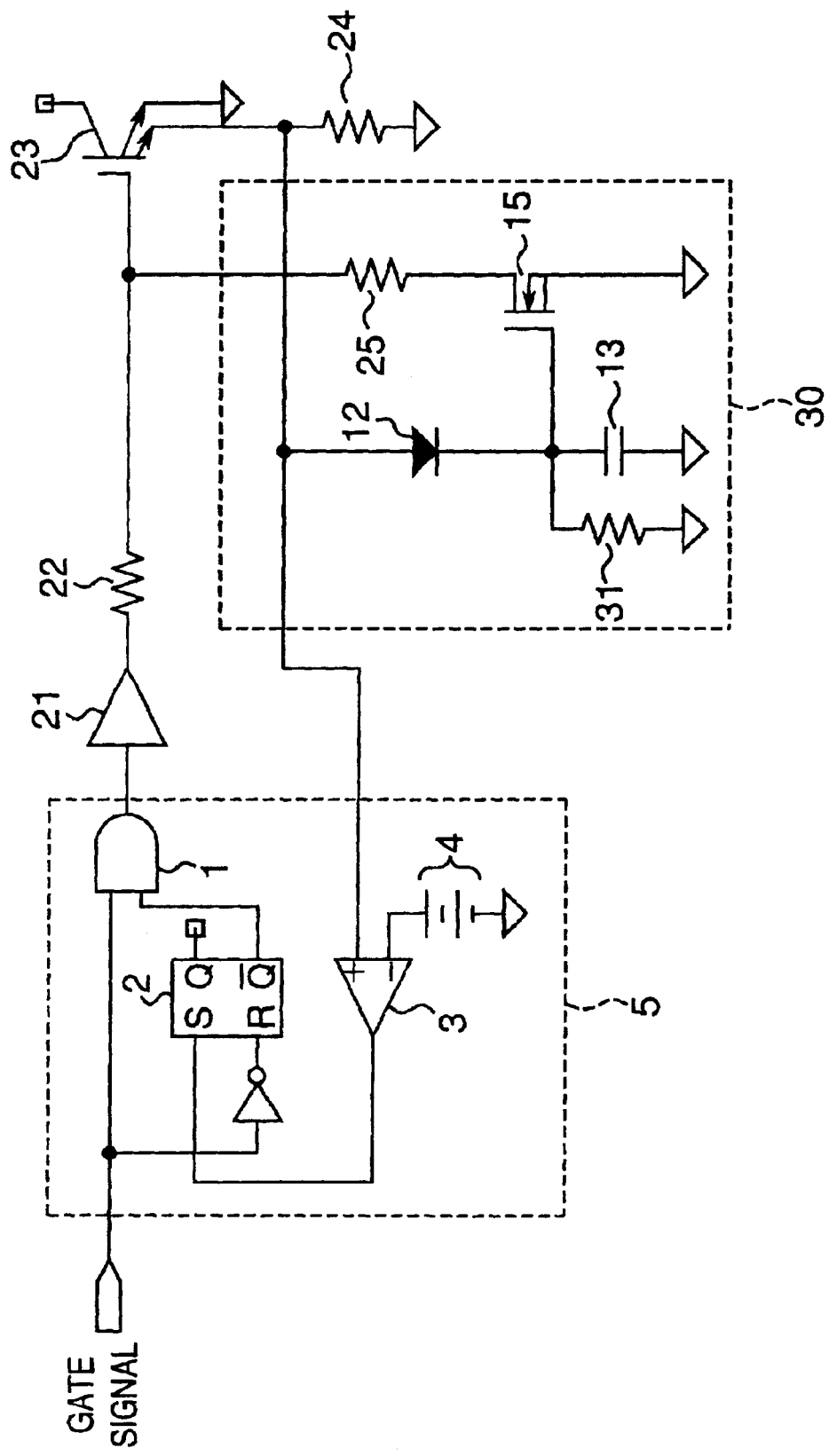
FIG. 3 is a block diagram showing a part of the configuration of a power control circuit employing a semiconductor protection circuit consisting of a low speed protection circuit and a high speed protection circuit according to the second embodiment of the present invention.

FIG. 3 shows apart of the configuration of a power control circuit employing a semiconductor protection circuit consisting of a protection circuit and a high speed protection circuit (or FAS circuit) according to the second embodiment of the present invention. The semiconductor protection circuit has the same constituent elements as those in the first embodiment. Besides, in the second embodiment, the FAS circuit 30 has a capacitor discharging resistor 31 having a predetermined resistance value and connected to a capacitor 13 in parallel. It is noted that the capacitor discharging resistor 31 corresponds to "a first resistor" recited in claims.

With the configuration of the semiconductor protection circuit in the first embodiment stated above, the MOSFET 15 of the FAS circuit 10 is kept to be turned on until charges held by the capacitor 13 are discharged by a leak current. Due to this, even if troubles such as short-circuit causing the malfunction of the FAS circuit 10 is eliminated, the semiconductor switching circuit cannot return to normal operation. To deal with this disadvantage, the capacitor discharging resistor 31 in the second embodiment is connected in parallel to the capacitor 13. Thus, it is possible to realize an increase in the capacity of the capacitor 13 depending on the setting of the resistance value of the capacitor discharging resistor 31, thereby expanding the setting range of a circuit constant. For example, it is possible to arbitrarily set time for which the MOSFET 15 is kept to be turned on, i.e., the operation timing of the FAS circuit 30 when the FAS circuit 30 operates, based on the time constant of the capacitor discharging resistor 31 and that of the capacitor 13. In addition, if the capacity of the capacitor 13 increases, it is possible to prevent malfunction due to an external function such as external noise.

Third Embodiment.

Figure 4:
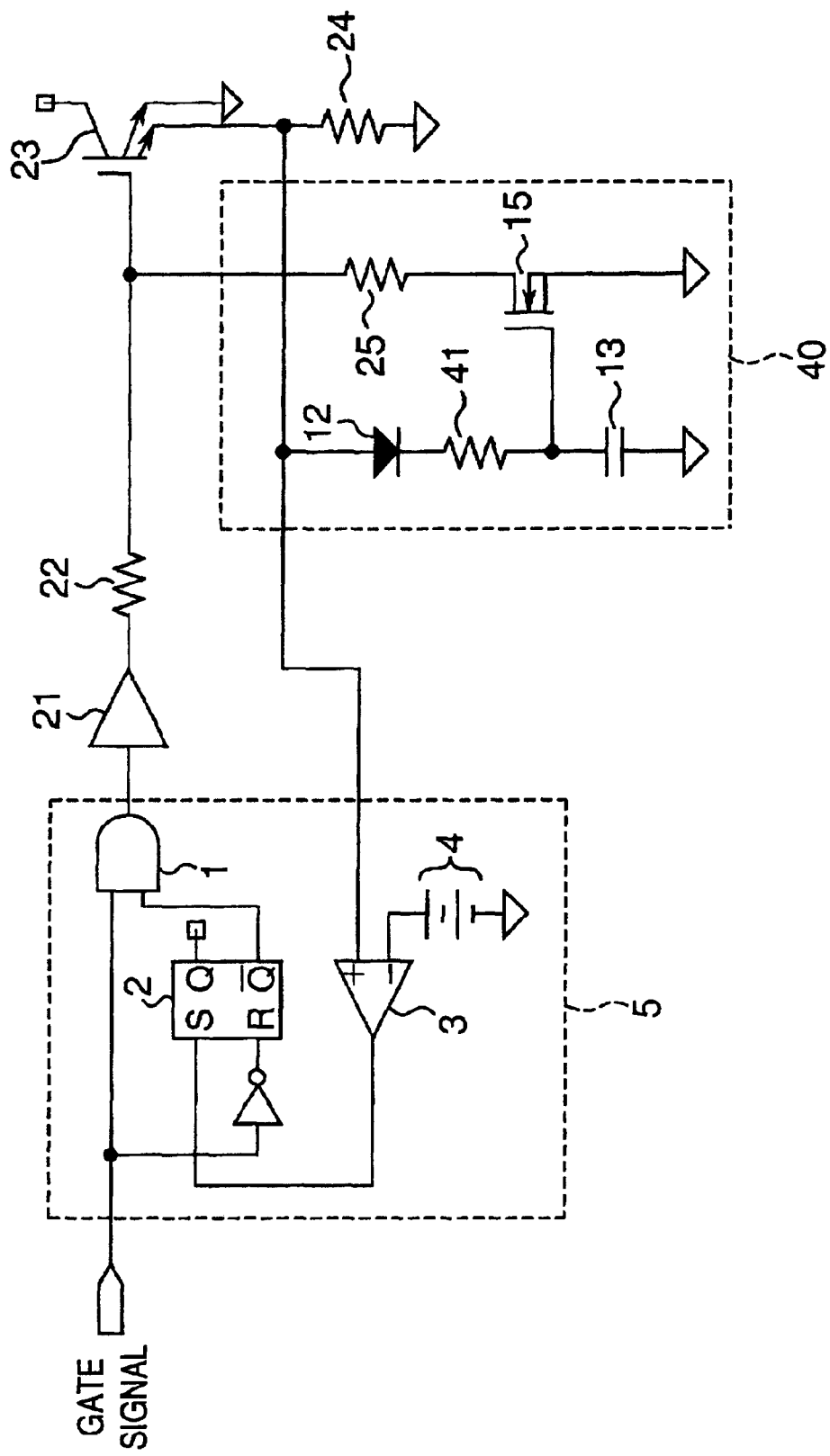
FIG. 4 is a block diagram showing a part of the configuration of a power control circuit employing a semiconductor protection circuit consisting of a low speed protection circuit and a high speed protection circuit according to the third embodiment of the present invention.

FIG. 4 shows apart of the configuration of a power control circuit employing a semiconductor protection circuit consisting of a protection circuit and a high speed protection circuit (FAS circuit) according to the third embodiment of the present invention. This semiconductor protection circuit has the same constituent elements as those in the first embodiment stated above. Besides, in the third embodiment, a resistor 41 with a predetermined resistance value is connected in series to a switching diode 12 on the cathode side of the diode 12 in the FAS circuit 40. It is noted that the resistor 41 corresponds to "a second resistor" recited in the claims.

In this case, the resistor 41 and the capacitor 13 form a kind of a primary delay filter. It is possible to arbitrarily set the operation timing of the FAS circuit 40 to be delayed according to the time constant of this filter. Also, in this case, it is possible to prevent malfunction due to an external function such as external noise.

Fourth Embodiment.

Figure 5:
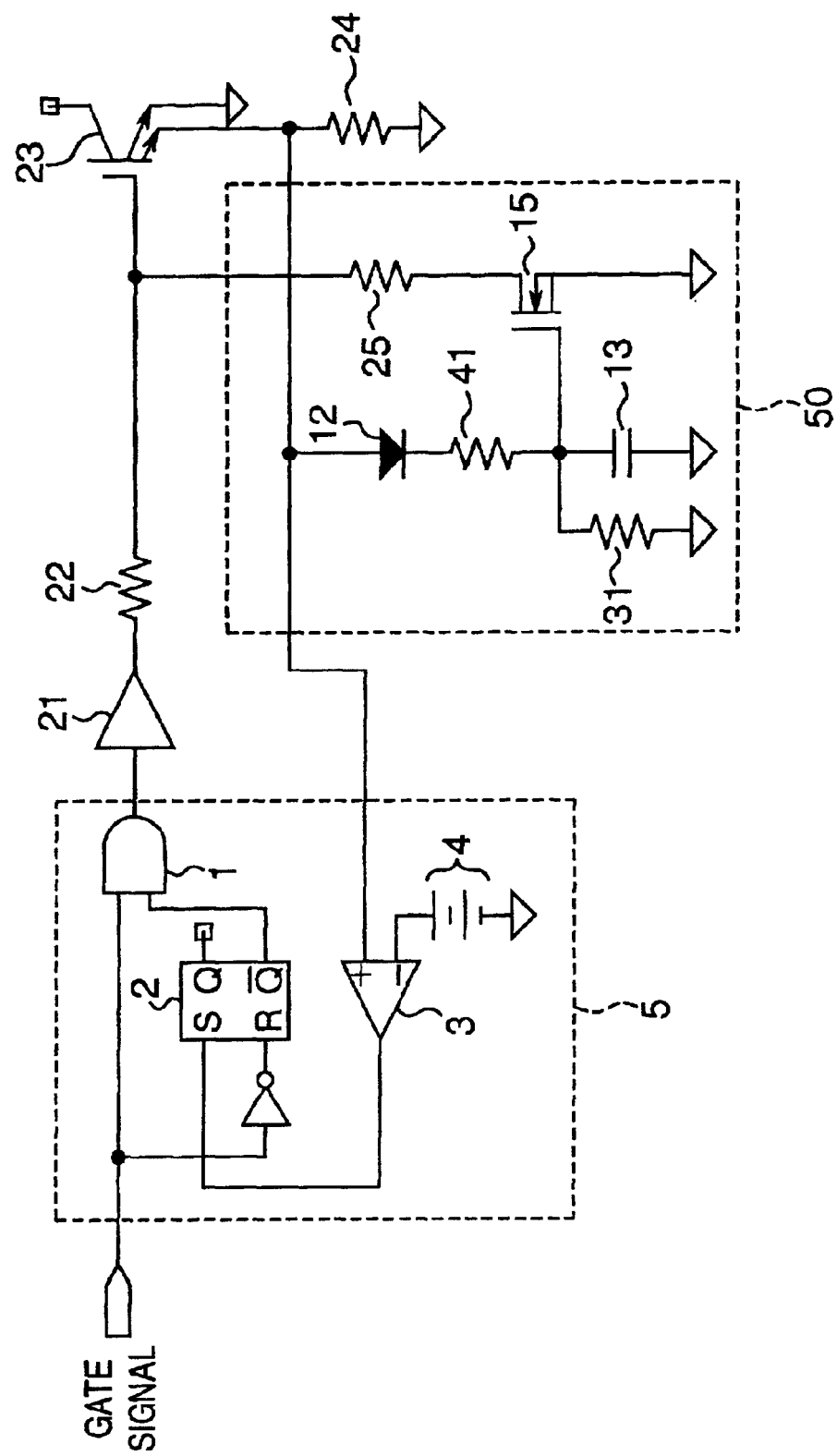
FIG. 5 is a block diagram showing a part of the configuration of a power control circuit employing a semiconductor protection circuit consisting of a low speed protection circuit and a high speed protection circuit according to the fourth embodiment of the present invention.

FIG. 5 shows apart of the configuration of a power control circuit employing a semiconductor protection circuit consisting of a protection circuit and a high speed protection circuit (FAS circuit) according to the fourth embodiment of the present invention. In the fourth embodiment, a combination of the configurations of the second and third embodiments stated above is adopted. In a FAS circuit 50, a capacitor discharging resistor 31 is connected in parallel to a capacitor 13 and a resistor 41 is connected in series to a switching diode 12 on the cathode side of the diode 12.

With this configuration, by providing the capacitor discharging resistor 31 and the resistor 41, it is possible to arbitrarily set the on/off timing of a MOSFET 15, i.e., the operation timing of the FAS circuit 50 for the reasons stated in the second and third embodiments.

Fifth Embodiment.

Figure 6:
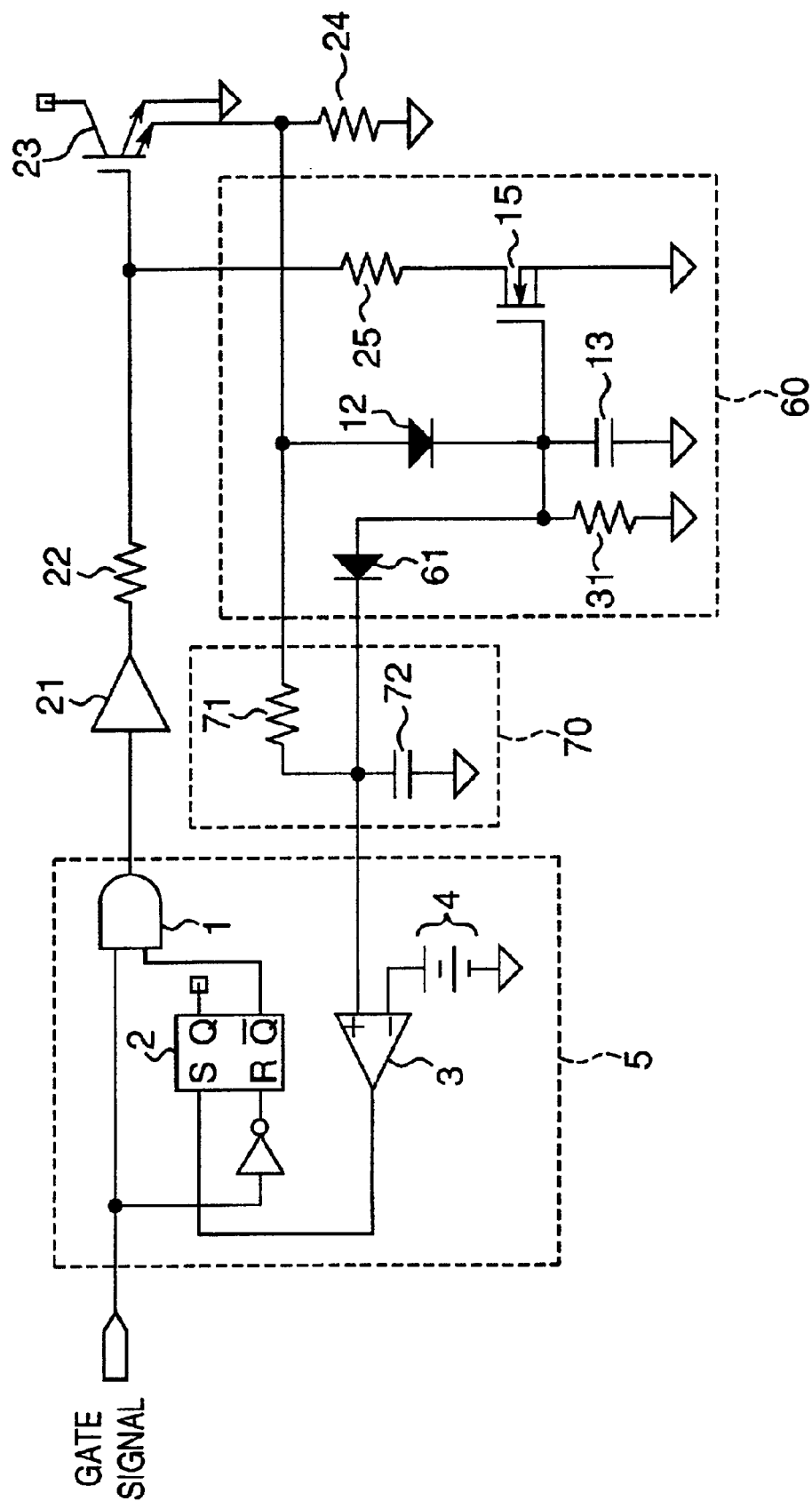
FIG. 6 is a block diagram showing a part of the configuration of a power control circuit employing a semiconductor protection circuit consisting of a low speed protection circuit and a high speed protection circuit according to the fifth embodiment of the present invention.
Figure 7:
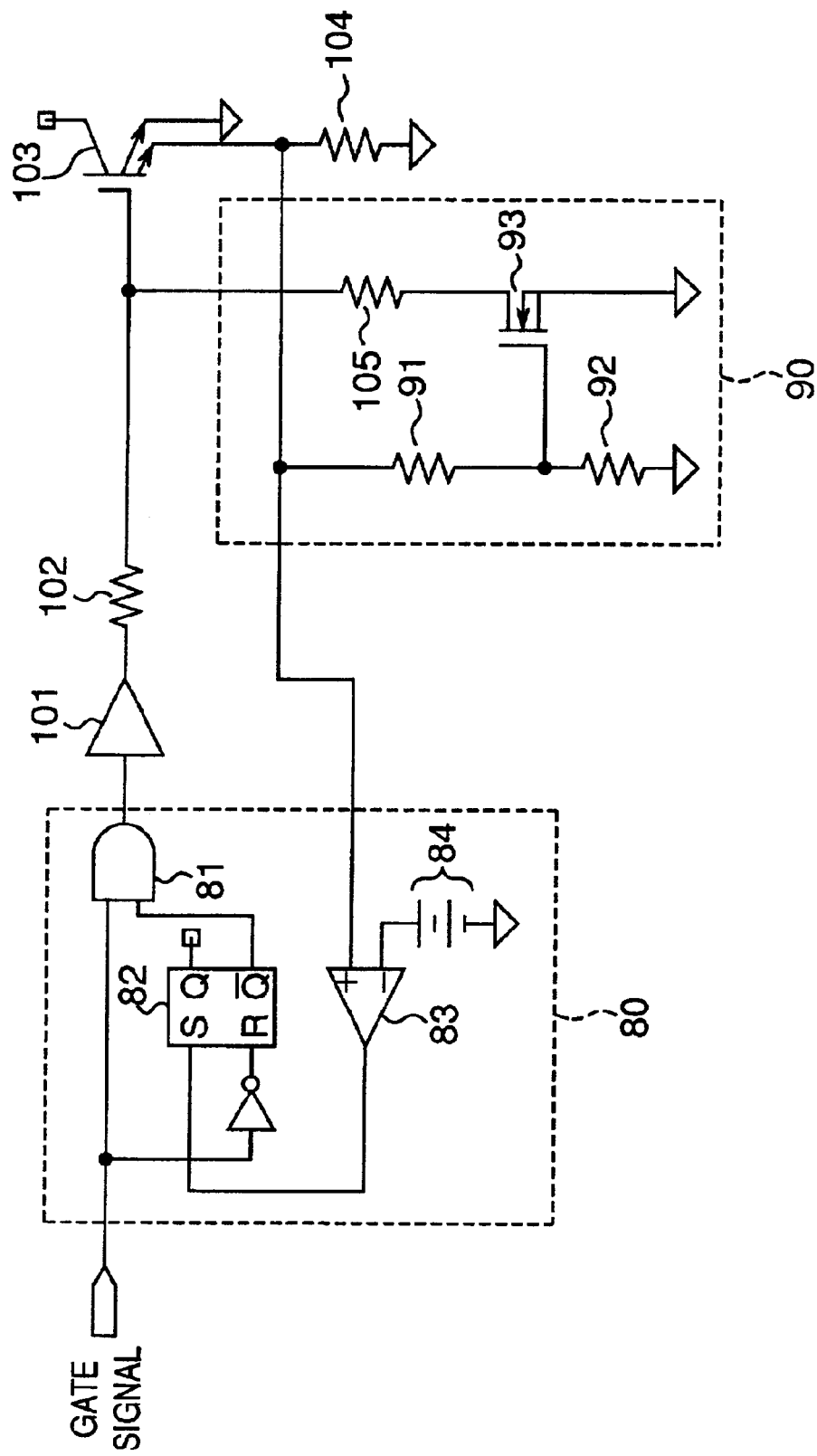
FIG. 7 is a block diagram showing a part of the configuration of a power control circuit employing a conventional semiconductor protection circuit consisting of a low speed protection circuit and a high speed protection circuit.
Figure 8:
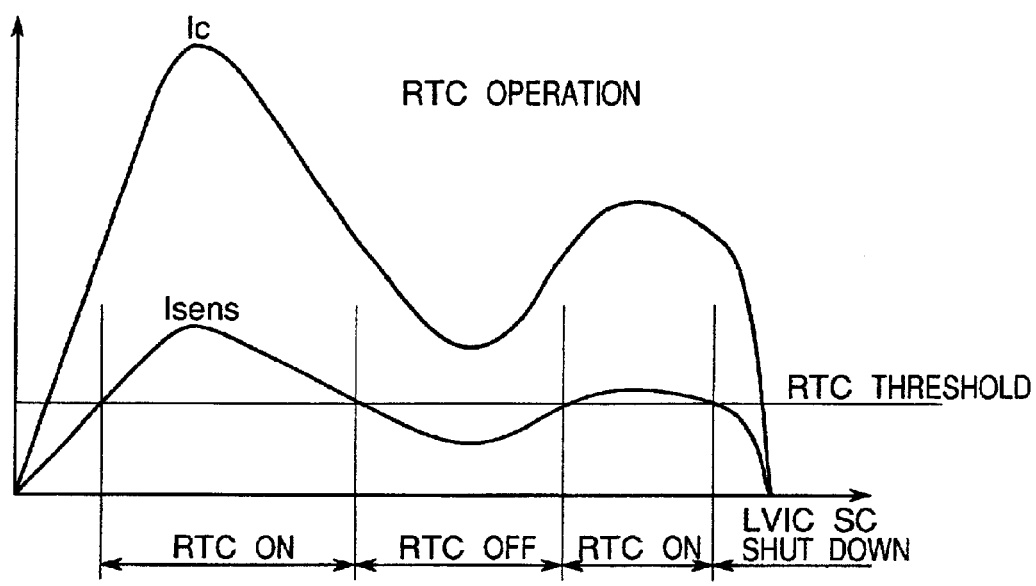
FIG. 8 is a graph showing the waveform of the collector current Ic of a semiconductor switching element and that of the current Isens of the current detection terminal of the semiconductor switching element when the conventional high speed protection circuit operates.

FIG. 6 shows a part of the configuration of a power control circuit employing a semiconductor protection circuit consisting of a protection circuit and a high speed protection circuit (FAS circuit) according to the fifth embodiment of the present invention. A semiconductor protection circuit has the same constituent elements as those in the second embodiment stated above. Besides, in a FAS circuit 60, a transmission diode 61 having a cathode connected to the comparator 3 in a low speed protection circuit 5 is connected to a capacitor discharging resistor 31. This transmission diode 61 transmits information that a semiconductor switching element 23 is shut off following the operation of the FAS circuit 60, to the low speed protection circuit 5.

In the semiconductor protection circuit (see FIG. 2) in the second embodiment stated above, if the semiconductor switching element 23 is shut off by the operation of the FAS circuit 30, the MOSFET 15 is turned off after a certain time by the function of the capacitor discharging resistor 31. Then, until the MOSFET 15 of the FAS circuit 30 is turned off, it is necessary that the low speed protection circuit 5 keeps the output voltage of the driving circuit of the semiconductor switching element 23 to be negative or 0 volts. Normally, however, a malfunction prevention low-pass filter 70 (not shown in FIG. 2) provided with a resistor 71 and a capacitor 72 is disposed upstream of the comparator 3 serving as the overcurrent detector in the low speed protection circuit 5. Due to this, if trouble such as short-circuit occurs and the FAS circuit 30 shuts off the semiconductor switching element 23 in a shorter time than the time constant of the low-pass filter 70, the protection circuit 30 cannot detect that trouble such as load short-circuit occurs. As a result, if the MOSFET 15 of the FAS circuit 30 is turned off, the semiconductor switching element 23 is turned on and trouble such as load short-circuit may possibly occur again.

To prevent this disadvantage, in the fifth embodiment, the FAS circuit 60 has the transmission diode 31 provided between the capacitor 31 and the comparator 3 of the low speed protection circuit 5. Thus, even if the semiconductor switching element 23 is shut off in a shorter time than the delay of the overcurrent detection of the low speed circuit 5, the low speed protection circuit 5 can detect that trouble such as short-circuit occurs based on the voltage accumulated in the capacitor 31 and can deal with the trouble. As a result, it is possible to ensure that the breaking of the semiconductor switching circuit 23 is prevented.

The present invention should not be limited to the embodiments stated so far. Needless to say, various modifications and changes in design can be made in the scope of the present invention.

What is claimed is:

1. A semiconductor protection circuit comprising:
    a low speed protection circuit having overcurrent detector for detecting an overcurrent in a predetermined semiconductor switching element, and turning off the semiconductor switching element following detection of the overcurrent; and
    a high speed protection circuit turning off the semiconductor switching element based on a voltage signal proportional to an output current from the semiconductor switching element, wherein
        said high speed protection circuit includes:
            a MOSFET having a drain connected to a gate of the semiconductor switching element;
            a diode having a cathode which is connected to a gate of the MOSFET, and a anode through which the voltage signal proportional to the output current from the semiconductor switching element is inputted to the diode; and
            a capacitor having one end connected to said cathode of the diode and to said gate of the MOSFET.

2. The semiconductor protection circuit according to claim 1, wherein
    a first resistor with a predetermined resistance value is connected to said capacitor in parallel.

3. The semiconductor protection circuit according to claim 1, wherein
    a second resistor with a predetermined resistance value is connected between said diode and said capacitor in series.

4. The semiconductor protection circuit according to claim 1, wherein
    a transmission diode, having an anode connected to the capacitor and a cathode connected to said overcurrent detector in the low speed protection circuit, is provided between the capacitor and the overcurrent detector.

* * * * *